(12) United States Patent
Frankowsky (10) Patent No.: US 6,580,613 B2
(45) Date of Patent: Jun. 17, 2003

(54) SOLDER-FREE PCB ASSEMBLY (75) Inventor: Gerd Frankowsky, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/907,894

(22) Filed: Jul. 17, 2001

(65) Prior Publication Data

US 2003/0016503 A1 Jan. 23, 2003

(51) Int. Cl.[7] .................................................. H05K 7/20
(52) U.S. Cl. ........................ 361/719; 257/785; 439/66; 439/84
(58) Field of Search ............................. 174/52, 4, 260; 257/706, 707, 713, 723, 724, 737, 785; 439/66, 86, 68–72, 80, 81, 84, 91, 485; 361/702, 704, 717–719, 722, 767, 768, 770, 773

(56) References Cited

U.S. PATENT DOCUMENTS 4,742,385 A * 5/1988 Kohmoto .................... 257/697
5,155,661 A * 10/1992 Nagesh et al. ............... 361/715
5,473,510 A * 12/1995 Dozier, II .................... 361/719
5,959,840 A * 9/1999 Collins et al. ............... 361/713
6,325,552 B1 * 12/2001 Brillhart ....................... 385/88

* cited by examiner

Primary Examiner—Gerald Tolin
(74) Attorney, Agent, or Firm—Lerner, David, Littenberg, Krumholz & Mentlik, LLP (57) ABSTRACT

An electronic component assembly is disclosed. The electronic component assembly may comprise a printed circuit board, a frame secured to the printed circuit board and one or more electronic components mounted in the frame and arranged in electrical contact with conductive traces of the printed circuit board, wherein no solder is used to connect the electronic components to the printed circuit board. A method for assembling the electronic component assembly is also disclosed.

19 Claims, 6 Drawing Sheets

SOLDER-FREE PCB ASSEMBLY

FIELD OF THE INVENTION

The present invention relates to electronic component and printed circuit board (PCB) assemblies. More particularly, the present invention relates to an electronic component assembly which does not require solder to secure conductive terminals of one or more electronic components to conductive traces of an associated printed circuit board.

BACKGROUND OF THE INVENTION

Traditional printed board assemblies include integrated circuits (ICs) and other electronic components soldered to conductive traces of an associated printed circuit board. While solder has proved to be effective in some respects for connecting electronic components to a printed circuit board and for transmitting current from an associated power source to such electronic components, there are various problems associated with the use of solder.

One significant problem is that soldered electronic components are exposed to very high temperatures during the soldering process. Thus, the electronic components are subjected to substantial temperature stress, which may cause immediate or future performance failures. In order to minimize such failures, soldered ICs are subjected to various manufacturing and quality assurance procedures, which are complex and costly.

Quality assurance inspections often require that each solder joint be inspected multiple times during the process of manufacturing a printed circuit board. For example, one such inspection may be required to assure that the solder joint connecting a conductive terminal of a electronic component to a conductive trace of a printed circuit board has been properly formed and does not include any voids. Another inspection step may be required after the associated PCB assembly has been completed to assure that flux used during the soldering process has been removed during preliminary or final cleaning operations.

Another problem associated with soldered electronic components is that solder must be removed (i.e., the electronic component must be de-soldered) in the event of a failure or when it is desired to upgrade the component. The de-soldering process exposes electronic components on the associated PCB to additional temperature stresses and cleaning procedures. In the event a new component is re-soldered in place of the failed component, again the risk associated with high temperature stress exists and additional quality control inspections and cleaning procedures are required.

In order to avoid the potential problems and cost associated with the use of solder, substantial efforts have been made to develop procedures for solder-free connections of conductive terminals of electronic components to conductive traces of PCBs. One such effort involves staking of the conductive terminals of associated electronic components into plated through-holes of an associated PCB. This process requires special solderless pins to be used as conductive terminals of the electronic components. Several problems exist with staking procedures including increased costs, increased manufacturing steps, incompatibility of materials and electronic component failures due to mechanical stresses exerted thereon during the staking process.

Accordingly, the existing procedures and assemblies having soldered and solderless connections have various shortcomings. The need therefore exists for a new electronic component assembly that overcomes the existing problems.

SUMMARY OF THE INVENTION

The present invention overcomes the shortcomings in the prior art by providing an electronic component assembly that does not need or use solder to connect conductive terminals of one or more associated electronic components to conductive traces of an associated PCB. In one embodiment, the electronic component assembly comprises a PCB having conductive traces thereon. A frame having at least one compartment therein may be secured to the PCB. At least one electronic component having conductive terminals thereon is retained in at least one compartment of the frame such that the conductive terminals thereof are aligned and in contact with the conductive traces of the PCB. No solder is required in this assembly to retain the conductive terminals of the electronic component in contact with the conductive traces of the PCB.

Preferably, the assembly comprises a heatsink arranged in contact with at least one electronic component thereof. The heatsink may be arranged on the frame and may be used to retain at least one electronic component within the frame compartment such that the conductive terminals thereof are retained in contact with the corresponding traces of the PCB. In one embodiment, the heatsink may be generally u-shaped. In other embodiments, the heatsink may have any configuration suitable for maintaining it in contact with one or more electronic components within the frame.

It is preferable for the conductive terminals of the at least one electronic component to extend vertically outward toward the conductive traces of the PCB. The assembly may include adhesive composition used to secure the electronic components to the frame. The frame may be secured to the associated PCB in various ways, including, but not limited to, adhesives, rivets, screws, clamps and other mechanical means.

In a preferred embodiment, the at least one electronic component comprises a plurality of electronic components and the at least one frame compartment comprises a plurality of compartments, where each electronic component is retained in a respective compartment.

The frame may comprise a shoulder within each compartment. The electronic components preferably include a die and conductive terminals extending outwardly from the die. The die may be arranged to abut the shoulder within the compartment when the electronic component is in assembled position. In the embodiment where a shoulder is included within a frame compartment, it is preferable for the shoulder to comprise opposing shoulders, and for the die of the electronic component to abut the opposing shoulders when the electronic component is arranged in assembled position.

As the electronic component assembly of the present invention does not require the use of solder, it is preferable for the conductive terminals of the electronic components to be constructed to deform from a first elongated configuration to a second compressed configuration upon application of a sufficient force thereto whereby the conductive terminals are maintained in contact with the conductive traces of the associated PCB.

In another embodiment of the present invention, the electronic component assembly does not specifically include an associated PCB, but is intended to be mounted on a PCB. Preferably, the electronic component assembly comprises a frame, which is adapted to be secured to a PCB. One or more electronic components are also provided, each having conductive terminals thereon. The frame defines one or more compartments in which corresponding ones of the electronic components are retained.

The electronic component assembly may also comprise a heatsink arranged in contact with the electronic components thereof. The heatsink is preferably arranged on the frame and functions at least, in part, to either dissipate heat away from the electronic components or to retain the electronic components within corresponding frame compartments. In one embodiment, the heatsink may have a unshaped configuration.

In accordance with another aspect of the invention, a method of assembling an electronic component assembly is provided. In one embodiment, the method comprises attaching a frame to a PCB. At least one electronic component is then inserted into a corresponding compartment of the frame in a position such that conductive terminals thereof are placed in contact with conductive traces of the PCB. A heatsink device is then placed on the frame in contact with at least one electronic component to secure the electronic components in assembled position.

In accordance with another method of the present invention, one or more electronic components may first be inserted corresponding compartments of a frame. A heatsink is then connected to the frame and secures the electronic components therein to form an assembly. The assembly is then attached to a corresponding PCB such that the conductive terminals of electronic components fixed within the frame are arranged in contact with the conductive traces of the PCB.

The foregoing aspects, features and advantages of the present invention may be further appreciated with references to the following description of the preferred embodiments and accompanying drawings.

DETAILED DESCRIPTION OF THE PREFERRED EMBODIMENTS

An electronic component assembly 10 is shown in FIGS. 1–4 in accordance with one preferred embodiment of the present invention. The assembly 10 includes a frame 12, a PCB 24 on which the frame 12 is mounted and one or more electronic components 30, such as dynamic random access memory (DRAM) integrated circuits (ICs) mounted on the frame 12.

Figure 1:
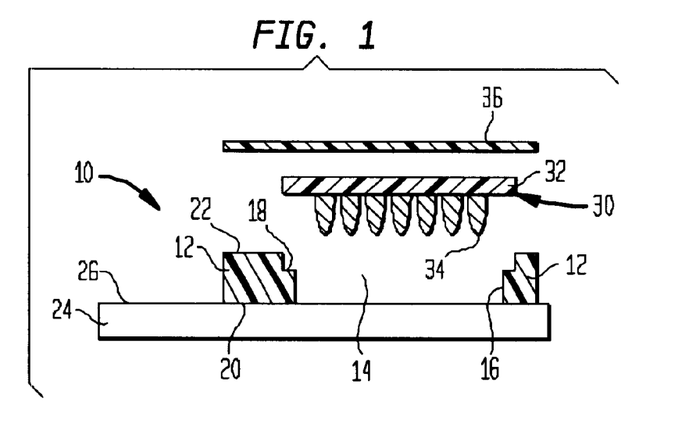
FIG. 1 is a partially exploded schematic cross-sectional view of the assembly of the present invention.
Figure 3A:
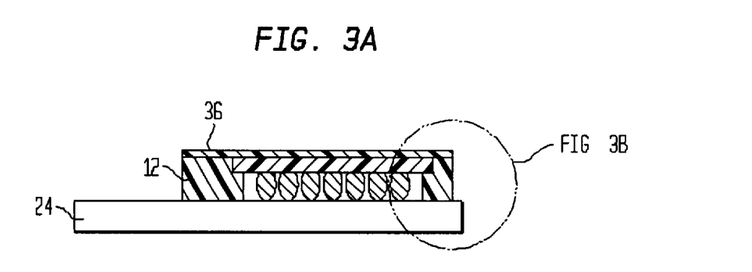
FIG. 3A is a schematic cross-sectional view of the assembly of FIGS. 1 and 2A in an assembled state.
Figure 3B:
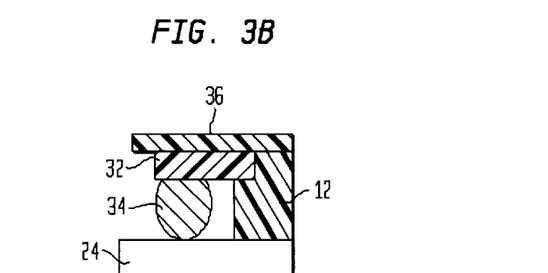
FIG. 3B is an enlarged cut-away view of a designated portion of FIG. 3A.
Figure 4:
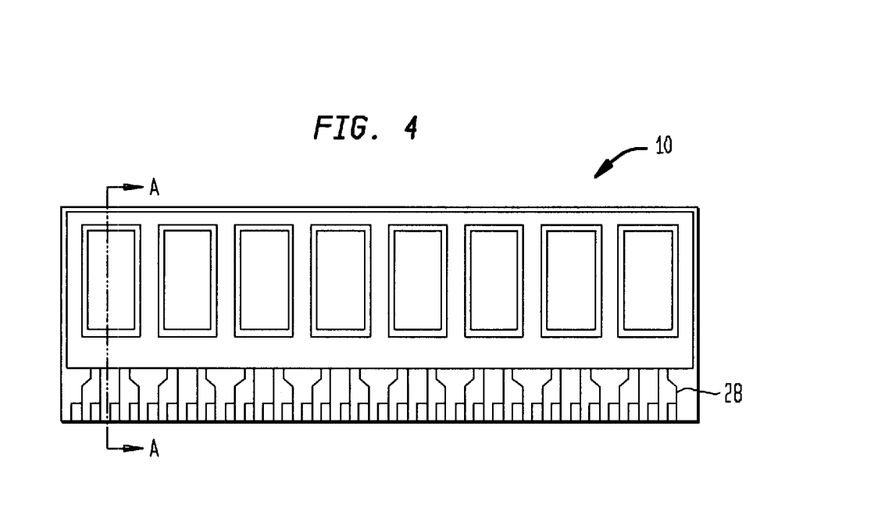
FIG. 4 is a schematic top plan view of the assembly of FIG. 1 in an assembled state.

FIG. 1 is a partially exploded cross-sectional view taken along line A—A of FIG. 4. It illustrates that the frame 12 includes a plurality of compartments 14 defined by inner walls 16. In the embodiment disclosed in FIGS. 1–4, a shoulder 18 extends peripherally around the inner wall 16 of the compartment 14. The shoulder 18 acts as a compression stop on which a die 32 of a corresponding IC 30 rests when the IC 30 is in assembled position.

Figure 2A:
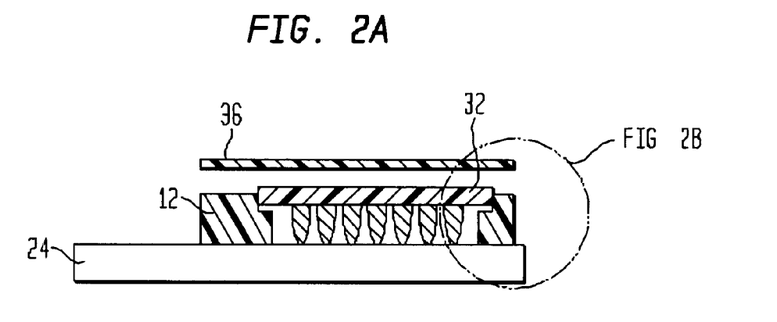
FIG. 2A is a partially exploded cross-sectional view of the assembly of FIG. 1 in a more assembled state.
Figure 2B:
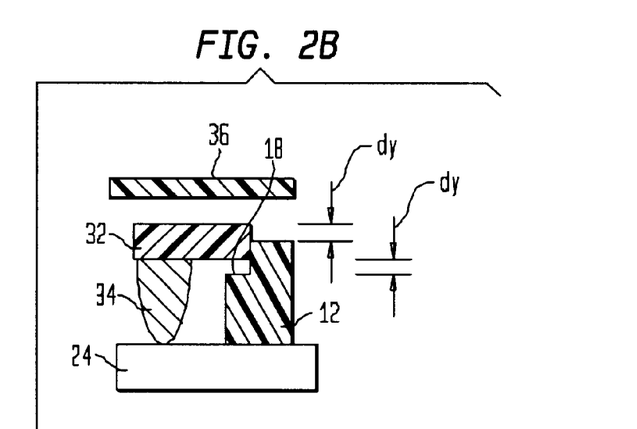
FIG. 2B is an enlarged cut-away view of a designated portion of FIG. 2A.

The frame 12 has a bottom surface 20 shown in FIGS. 1–3 seated on an upper surface 26 of the corresponding PCB 24. The frame 12 also includes a top surface 22, which preferably surrounds each compartment 14.

The frame 12 is preferably made of a polymeric material, but can be made of any material sufficient to retain ICs 30 in assembled position. Preferably, the frame 12 is made of a material having a relatively high resistivity so as to avoid any short circuit condition from interfering with operation of the electronic component assembly 10.

The PCB 24 can be any conventional PCB, and for the purpose of the present invention is not limited to any particular type of PCB. In this regard, PCB 24 can be rigid or flexible and may include any substrate having a conductive trace pattern thereon. PCB 24 is shown in FIGS. 1–4 as including a surface 26 on which conductive traces 28 (shown in FIG. 4) are arranged. As used herein, the term "conductive traces" should be understood to include any conductive flow path on a PCB such as conductive pads, conductive terminals and the like.

In accordance with the preferred embodiments of the present invention, including the embodiments shown in FIGS. 1–4, electronic components such as IC 30 include a die 32 and conductive terminals 34 extending vertically outward from the die 32. Although the electronic component discussed in connection with the preferred embodiments of the present invention is an IC, it should be understood that any electronic component having conductive terminals thereon can be used in accordance with the present invention. Thus, the term "IC" should be understood to include integrated circuits and other electronic components. In a preferred embodiment, IC 30 may comprise a DRAM having vertically arranged conductive terminals 34. However, electronic components having various other types of conductive terminals can be used within the scope of the present invention.

The assembly 10 also includes a heatsink 36. As is known in the art, heatsinks are used to dissipate heat away from electronic circuit components. With respect to the present invention, heatsink 36 may also act to retain IC 30 in assembled position within corresponding compartment 14 of frame 12. As shown in FIGS. 1–4, heatsink 36 has a generally planar and elongated configuration. When IC 30 is placed in compartment 14 of frame 12, heatsink 36 is placed thereon so that it contacts die 32.

During assembly of the electronic component assembly 10, it may be necessary to exert an external force normal to the surface of heatsink 36 to compress the conductive terminals 34 of IC 30 until a desired contact is formed between the conductive terminals 34 and corresponding conductive traces 28 formed on the surface 26 of PCB 24.

As shown in the embodiment of FIG. 2B, when heatsink 36 is first placed on die 32, a space represented by "dy" exists between an inner surface of die 32 and shoulder 18. The same space dy also exists between the inner surface of heatsink 36 and the top surface 22 of frame 12. When a sufficient force is exerted normal to the surface of heatsink 36 (i.e., toward PCB 24), the space dy at both locations shown in FIG. 2B is eliminated as conductive terminals 34 are designed to deform to a certain extent. Such deformation is illustrated in FIG. 3B. The deformation may be based on an inherent property of the conductive material of terminals 34. In its uncompressed state, conductive materials is considered herein as being in a first elongated configuration. In its final assembled position, where deformation has taken place, conductive terminals 34 are considered herein to be in their compressed configuration.

The reason that ICs 30, 130, 230 and 330 of FIGS. 1–15 may be compressed so that at least some of the conductive terminals thereof are deformed when they are forced into contact with conductive traces of an associated PCB is that the PCB often does not have perfect planarity and because the vertically extending conductive terminals thereof are often not perfectly uniform in the length that they extend from the associated die. Thus, pressing the ICs against the corresponding PCB results in deformation of certain of the vertical contacts elements as illustrated in FIGS. 2B and 3B discussed above and FIGS. 8 and 9 discussed below.

Adhesive composition (not shown) may be arranged between the heatsink 36 and the top surface 22 of frame 12 to secure heatsink 36 in its final assembled position. Alternatively, various mechanical devices such as screws, rivets, clamps or then like may be used to secure heatsink 36 in assembled position on frame 12. Further, it should be appreciated that heatsink 36 may be integral with frame 12 in alternate embodiments of the present invention, such as the embodiments shown in FIGS. 13–15. Thus, although heatsink 36 and frame 12 are discussed herein as being separate components a frame assembly having an integral heatsink, or any other structure designed to retain IC 30 in assembled position within corresponding compartment 14 is within the scope of the present invention.

Frame 12 can be secured to PCB 24 by any means including, but not limited to, adhesive compositions, screws, rivets, clamps and the like.

The embodiment of the present invention shown in FIGS. 1–3 is considered a single sided module. That is, ICs 30 are only mounted on one side of PCB 24. In accordance with another preferred embodiment, a double-sided module is disclosed. That is, ICs may be mounted on both sides of an associated PCB. In particular, FIGS. 5–7 disclose a double sided module embodiment having an alternate shaped heatsink. For convenience of reference, like numerals represent like elements with respect to all embodiments of the present invention. Where alternate embodiments are shown, such as the embodiment of FIGS. 5–7, like reference numerals are proceeded with a "1", "2"or "3".

Figure 5:
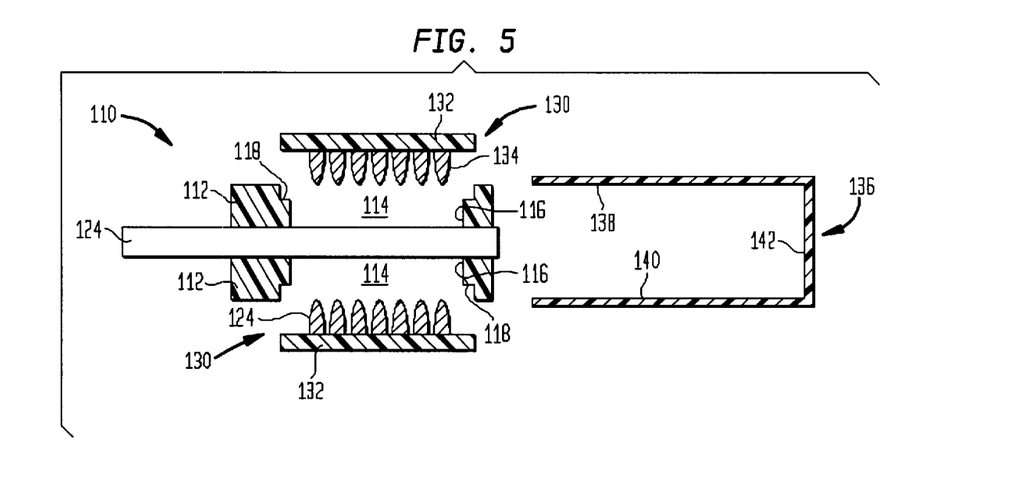
FIG. 5 is a partially exploded schematic cross-sectional view of a second embodiment of the present assembly.
Figure 6:
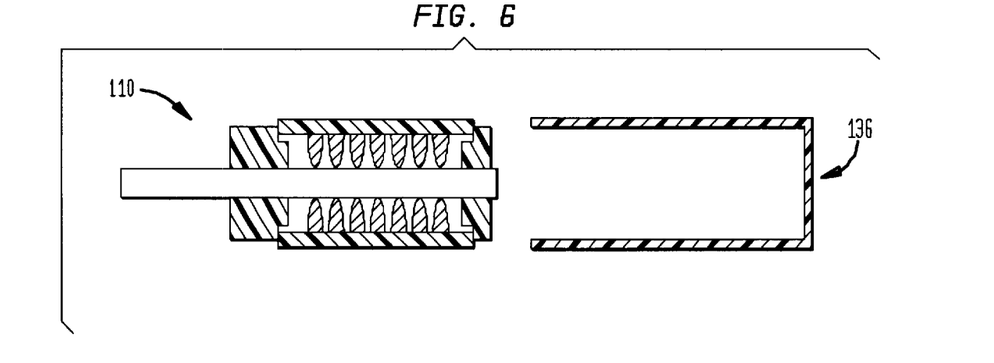
FIG. 6 is a partially exploded cross-sectional view of the assembly of FIG. 5 in a more assembled state.
Figure 7:
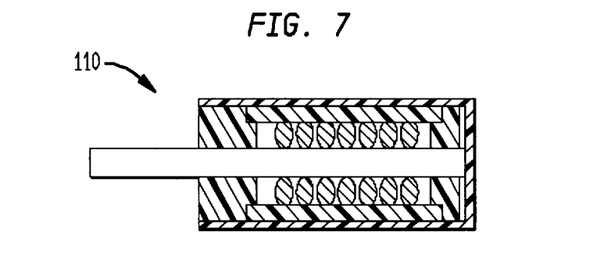
FIG. 7 is a schematic cross-sectional view of the assembly of FIGS. 5 and 6 in an assembled state.

With respect to FIGS. 5–7, the double-sided module includes a double-sided assembly 110. A double-sided frame 112 is mounted on assembly 110. Compartments 114 are arranged on both sides of the double-sided frame 112. The structure of the frame 112 is the same as the frame 12 discussed above with respect to FIGS. 1–4, except that the frame 112 includes two sides in which ICs 130 are mounted.

One structural difference in assembly 110 is that it includes a modified heatsink 136, which has a generally u-shaped configuration. Heatsink 136 includes a first contact arm 138, a second contact arm 140 extending generally parallel to first contact arm 138 and a connection piece 142 that connects contact arms 138 and 140.

Heatsink 136, like heatsink 36, may dissipate heat away from ICs 130 during operation of the PCB assembly 110. Various materials are known to those skilled in the art for dissipating heat. Thus, all embodiments of the heatsinks disclosed in the present invention can be made of existing known materials, or any future material that may become available sufficient to dissipate heat. In certain embodiments, it may not be necessary for the heatsink of the present invention to actually perform the function of dissipating heat. In such embodiments, the heatsink may simply retain associated ICs in assembled position within the frame.

As shown in FIG. 7, when the heatsink 136 is placed in assembled position on corresponding frame 112 and ICs 130, the first contact arm 138 is adjacent in an outer surface of upper die 132, while the second contact arm 140 is adjacent to an outer surface of lower die 132 so that both upper and lower ICs 130 are retained in assembled position within corresponding compartments 114 of frame 112. As with the embodiment of FIGS. 1–3, the double-sided module of FIGS. 5–7 is constructed and arranged such that conductive terminals 134 of corresponding ICs 130 remain in contact with corresponding conductive traces 128 on PCB 110 without solder. This solderless construction is highly advantageous for several reasons including its elimination of high temperature stresses and various costly manufacturing and inspection steps required in systems that need solder to connect electronic components to an associated PCB.

The present invention provides a particularly simple re-work process in the event that it is necessary to replace defective parts. With respect to high density memory systems incorporating desirable DRAM components, it is often necessary to guarantee a high module yield well in excess of 90%, such as when high capacity memory modules are used. In view of the high component yield requirement, it is particularly important to have a simple re-work process to replace defective ICs. The present invention accomplishes this goal.

Figure 8:
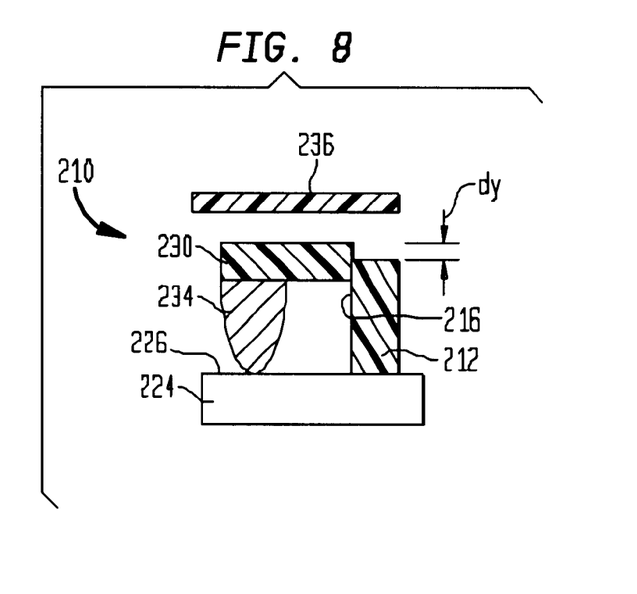
FIG. 8 is a partially explosed enlarged schematic view of a third embodiment of a portion of the present assembly.
Figure 9:
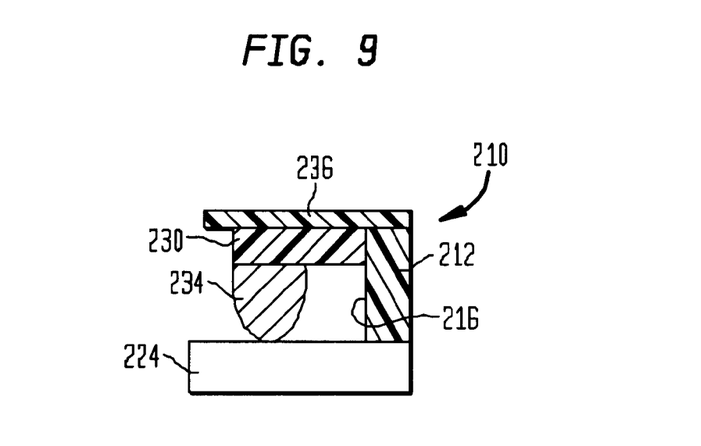
FIG. 9 is an enlarged schematic view of the portion of the assembly shown in FIG. 8 in an assembled state.

The forces exerted on the conductive terminals of the ICs shown in the preferred embodiments of FIGS. 1–15, which cause the deformation indicated in FIGS. 3B and 9, are tolerable largely due to the vertical nature of such conductive terminals. Thus, the present invention takes advantage of the compliance of the vertical arrangement of the conductive terminals of IC packages used in preferred embodiments of the present invention.

FIGS. 8 and 9 illustrate an alternate embodiment of a PCB assembly 210. The primary difference between the embodiment of FIGS. 8 and 9 and the embodiment shown in FIGS. 1–3B is that a frame 212 of the FIGS. 8–9 embodiment does not include a shoulder on which an associated IC 230 rest when in assembled position. In the design of FIGS. 8–9, the die 232 of IC 230 is not vertically supported by any part of frame 212. Instead, frame 212 is used only to register the conductive terminals 234 of IC 230 with associated conductive traces (not shown) of PCB 224. All other aspects of the PCB assembly 210 is the same as that of PCB assembly 10.

As also shown in FIGS. 8 and 9, when IC 230 is initially placed within corresponding compartment 214 of frame 212, a vertical space dy exists between the outer surface of die 232 and the top surface 222 of frame 212. However, this vertical space dy disappears when heatsink 236 is forced to its seated position adjacent top surface 222 of frame 212 while remaining in contact with outer surface of die 232. The compression force exerted upon IC 230 is tolerated as discussed above based on the inherently deformable nature of conductive terminals 234 and the vertical orientation thereof. FIG. 9 illustrates how conductive terminals 234 deform to a relatively compressed configuration from their initial relatively elongated configuration illustrated in FIG. 8.

Figure 10:
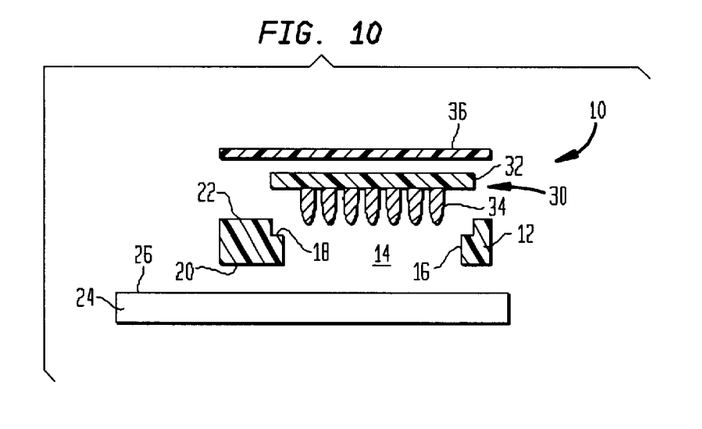
FIG. 10 is an exploded schematic cross-sectional view of an embodiment of the assembly of the present invention illustrating one aspect of a method of assembly.
Figure 11:
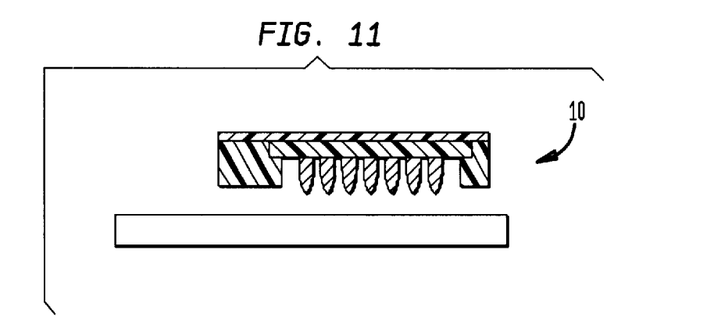
FIG. 11 is a partially exploded schematic cross-sectional view of the assembly of FIG. 10 shown in a more assembled state.
Figure 12:
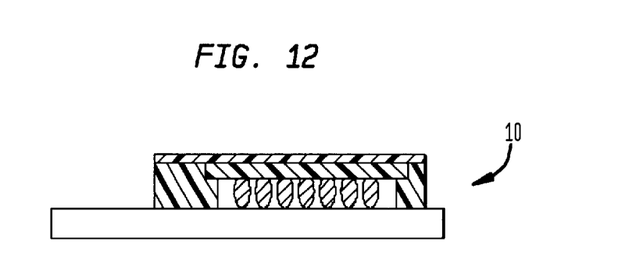
FIG. 12 is a schematic cross-sectional view of the assembly of FIGS. 10 and 11 shown in an assembled state.

FIGS. 10–12 disclosed another preferred embodiment of the present invention having a structure identical to the structure disclose in FIGS. 1–3B. However, FIGS. 10–12 illustrate an alternate method in assembling electronic component assembly 10. In essence, a package including frame 12, ICs 30 and heatsink 36 is fully assembled before placing the ICs 30 and frame 12 on associated PCB 24.

The advantage of pre-assembling the frame 12, ICs 30 and heatsink 36 is that the quantity of parts that need to be handled is reduced at the time of final mounting to an associated PCB.

Figure 13:
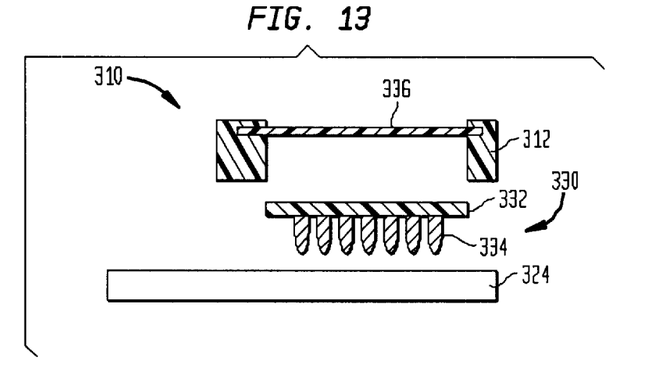
FIG. 13 is an exploded schematic cross-sectional view of a further embodiment of the assembly of the present invention illustrating one aspect of an alternate method of assembly.
Figure 14:
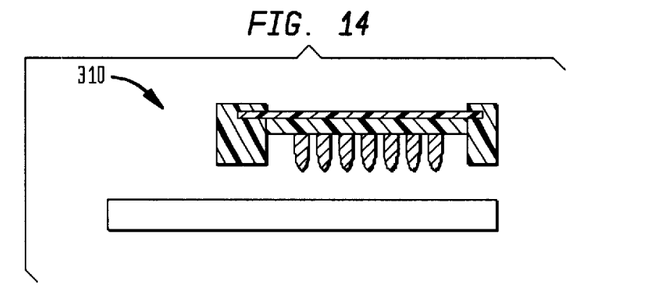
FIG. 14 is a schematic cross-sectional view of the assembly of FIG. 13 in an assembled state.
Figure 15:
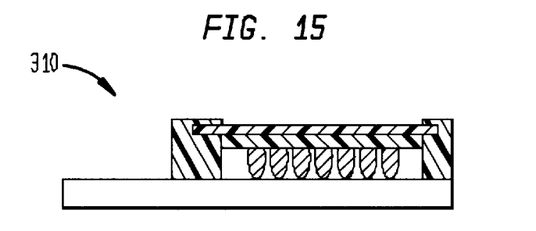
FIG. 15 is a schematic cross-sectional view of the assembly of FIGS. 13 and 14 shown in an assembled state.

Another embodiment of the present of the invention is shown in FIGS. 13–15. In this alternate embodiment, a heatsink 336 may be integrally molded or otherwise secured to a frame 312 prior to placement of one or more ICs 330 therein. As with the embodiments shown in FIGS. 8–9, the embodiment of FIGS. 13–15 do not include an internal shoulder as part of frame 312. Instead, ICs 330 are simply placed within corresponding compartments 314 of frame 312 until they abut an inner surface of heatsink 336.

The frame 312 can then be mounted on a surface 326 of an associated PCB 324 such that the vertically arranged conductive terminals 334 of IC 330 are in registration and in contact with corresponding conductive traces (not shown) of the surface 326 of PCB 324. An advantage of the embodiments shown in FIGS. 13–15 is also obtained due to the reduced quantity of PCB assembly parts which are handled during assembly operation. As with the other embodiments discussed herein, assembly of the various parts including the PCB, frame, ICs and heatsink is preferably obtained by using adhesive compositions, or other mechanical means such as screws, rivets or the like.

Although the invention herein has been described with reference to particular preferred embodiments, it is to be understood that such embodiments are merely illustrative of the structure and features of the present invention. Thus, it should be understood that numerous modifications can be made to the structure and arrangement of components and steps of the preferred methods without departing from the spirit and scope of the present invention as defined by the following claims.

What is claimed is:

1. An electronic component assembly comprising:
   (a) a printed circuit board having conductive traces thereon;
   (b) a frame secured to said printed circuit board, said frame defining at least one compartment;
   c) at least one electronic component having conductive terminals thereon, said at least one electronic component being retained in said at least one compartment such that said conductive terminals of said at least one electronic component are aligned and in contact with said conductive traces of said printed circuit board, wherein no solder is used to retain said conductive terminals of said at least one electronic component in contact with said conductive traces; and
   d) adhesive composition arranged between said at least one electronic component and said frame to secure said at least one electronic component to said frame.

2. The electronic component assembly of claim 1 further comprising a heatsink arranged in contact with said at least one electronic component.

3. The electronic component assembly of claim 2 wherein said heatsink is arranged on said frame and is used to retain said at least one electronic component within said at least one compartment.

4. The electronic component assembly of claim 3 wherein said heatsink has a u-shaped configuration.

5. The electronic component assembly of claim 1 wherein said conductive terminals of said at least one electronic component extend vertically outward toward said conductive traces of said printed circuit board.

6. The electronic component assembly of claim 1 wherein said frame comprises a shoulder within said compartment, said at least one electronic component including a die, said conductive terminals extending outwardly from said die, said die abutting said shoulder.

7. The electronic component assembly of claim 6 wherein said shoulder comprises opposing shoulders, said die abutting said opposing shoulders.

8. The electronic component assembly of claim 1 wherein said conductive terminals of said at least one electronic component are constructed to deform from a first elongated configuration to a second compressed configuration upon application of a sufficient force thereto such that said conductive terminals are retained in contact with said conductive traces of said printed circuit board.

9. An electronic component assembly comprising:
   (a) a printed circuit board having conductive traces thereon;
   (b) a frame secured to said printed circuit board, said frame defining a plurality of compartments;
   c) a plurality of electronic components having conductive terminals thereon, said plurality of electronic components being retained in respective ones of said plurality of compartments such that said conductive terminals thereof are aligned and in contact with said conductive traces of said printed circuit board, wherein no solder is used to retain said conductive terminals of said electronic components in contact with said conductive traces; and
   d) adhesive composition arranged between said plurality of electronic components and said frame to secure said electronic components to said frame.

10. The electronic component assembly of claim 9 further comprising at least one heatsink arranged in contact with said plurality of electronic components.

11. The electronic component assembly of claim 10 wherein said at least one heatsink is secured to said frame.

12. The electronic component assembly of claim 10 wherein said at least one heatsink has a u-shaped configuration.

13. The electronic component assembly of claim 9 wherein said frame comprises a shoulder within each of said compartments, each of said plurality of electronic components including a die, said conductive terminals extending outwardly from said die, said die of each electronic component abutting said shoulder.

14. The electronic component assembly of claim 13 wherein said shoulder comprises opposing shoulders, said die of each electronic component abutting respective ones of said opposing shoulders.

15. The electronic component assembly of claim 9 wherein said conductive terminals of said plurality of electronic components are constructed to deform from a first elongated configuration to a second compressed configuration upon application of sufficient force thereto such that said conductive terminals are retained in contact with said conductive traces of said printed circuit board.

16. An electronic component assembly comprising:
 (a) a printed circuit board having conductive traces thereon;
 (b) a frame secured to said printed circuit board, said frame defining at least one compartment and including a shoulder within the at least one compartment; and
 c) at least one electronic component including a die abutting said shoulder of said frame, and including conductive terminals extending outwardly from said die, said at least one electronic component being retained in said at least one compartment such that said conductive terminals of said at least one electronic component are aligned and in contact with said conductive traces of said printed circuit board, wherein no solder is used to retain said conductive terminals of said at least one electronic component in contact with said conductive traces.

17. The electronic component assembly of claim 16 wherein said shoulder comprises opposing shoulders, said die abutting said opposing shoulders.

18. An electronic component assembly comprising:
 (a) a printed circuit board having conductive traces thereon;
 (b) a frame secured to said printed circuit board, said frame defining a plurality of Compartments and including a shoulder within said compartments; and
 (c) a plurality of electronic components including a die abutting respective ones of said shoulders of said frame, and including conductive terminals extending outwardly from said die, said plurality of electronic components being retained in respective ones of said plurality of compartments such that said conductive terminals thereof are aligned and in contact with said conductive traces of said printed circuit board, wherein no solder is used to retain said conductive terminals of said electronic components in contact with said conductive traces.

19. The electronic component assembly of claim 18 wherein said shoulder comprises opposing shoulders, said die of each electronic component abutting respective ones of said opposing shoulders when said electronic components are arranged in assembled position within corresponding ones of said compartments.

* * * * *

UNITED STATES PATENT AND TRADEMARK OFFICE
CERTIFICATE OF CORRECTION

PATENT NO.    : 6,580,613 B2
DATED         : June 17, 2003
INVENTOR(S)   : Gerd H. Frankowsky It is certified that error appears in the above-identified patent and that said Letters Patent is hereby corrected as shown below:

Column 3,
Line 7, "unshaped" should read -- u-shaped --.

Column 10,
Line 8, "of Compartments" should read -- of compartments --.

Signed and Sealed this

Eighteenth Day of November, 2003

JAMES E. ROGAN
*Director of the United States Patent and Trademark Office*